United States Patent
Chirca et al.

(10) Patent No.: US 11,822,786 B2
(45) Date of Patent: Nov. 21, 2023

(54) DELAYED SNOOP FOR IMPROVED MULTI-PROCESS FALSE SHARING PARALLEL THREAD PERFORMANCE

(71) Applicant: TEXAS INSTRUMENTS INCORPORATED, Dallas, TX (US)

(72) Inventors: Kai Chirca, Dallas, TX (US); Timothy David Anderson, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 26 days.

(21) Appl. No.: 17/590,749

(22) Filed: Feb. 1, 2022

(65) Prior Publication Data
US 2022/0156193 A1  May 19, 2022

Related U.S. Application Data

(63) Continuation of application No. 16/601,947, filed on Oct. 15, 2019, now Pat. No. 11,269,774.
(Continued)

(51) Int. Cl.
*G06F 3/06* (2006.01)
*G06F 12/084* (2016.01)
(Continued)

(52) U.S. Cl.
CPC ............ *G06F 3/0604* (2013.01); *G06F 3/064* (2013.01); *G06F 3/0607* (2013.01); *G06F 3/0632* (2013.01); *G06F 3/0658* (2013.01); *G06F 3/0659* (2013.01); *G06F 3/0673* (2013.01); *G06F 3/0679* (2013.01); *G06F 9/30101* (2013.01); *G06F 9/30123* (2013.01); *G06F 9/3897* (2013.01); *G06F 9/4881* (2013.01); *G06F 9/5016* (2013.01); *G06F 12/0607* (2013.01); *G06F 12/084* (2013.01);
(Continued)

(58) Field of Classification Search
CPC ...... G06F 3/0604; G06F 3/064; G06F 3/0658; G06F 3/0679; G06F 9/5016; G06F 12/0811
See application file for complete search history.

(56) References Cited

U.S. PATENT DOCUMENTS 8,732,370 B2  5/2014 Chirca et al.
9,152,586 B2  10/2015 Wu et al.
(Continued)

*Primary Examiner* — Michelle T Bechtold
(74) *Attorney, Agent, or Firm* — Carl G. Peterson; Frank D. Cimino

(57) ABSTRACT

Techniques for maintaining cache coherency comprising storing data blocks associated with a main process in a cache line of a main cache memory, storing a first local copy of the data blocks in a first local cache memory of a first processor, storing a second local copy of the set of data blocks in a second local cache memory of a second processor executing a first child process of the main process to generate first output data, writing the first output data to the first data block of the first local copy as a write through, writing the first output data to the first data block of the main cache memory as a part of the write through, transmitting an invalidate request to the second local cache memory, marking the second local copy of the set of data blocks as delayed, and transmitting an acknowledgment to the invalidate request.

20 Claims, 8 Drawing Sheets

Related U.S. Application Data

(60) Provisional application No. 62/745,842, filed on Oct. 15, 2018.

(51) Int. Cl.

| | |
|---|---|
| *G06F 12/0811* | (2016.01) |
| *G06F 12/1009* | (2016.01) |
| *G06F 12/0875* | (2016.01) |
| *G06F 12/10* | (2016.01) |
| *G06F 12/0855* | (2016.01) |
| *G06F 12/06* | (2006.01) |
| *G06F 12/0817* | (2016.01) |
| *G06F 12/0831* | (2016.01) |
| *G06F 12/0815* | (2016.01) |
| *G06F 13/16* | (2006.01) |
| *G06F 13/40* | (2006.01) |
| *G06F 13/12* | (2006.01) |
| *H03M 13/01* | (2006.01) |
| *H03M 13/09* | (2006.01) |
| *H03M 13/15* | (2006.01) |
| *H03M 13/27* | (2006.01) |
| *G06F 9/30* | (2018.01) |
| *G06F 9/38* | (2018.01) |
| *G06F 9/48* | (2006.01) |
| *G06F 9/50* | (2006.01) |
| *G06F 12/0891* | (2016.01) |
| *G06F 12/0846* | (2016.01) |
| *G06F 12/0862* | (2016.01) |

(52) U.S. Cl.
CPC ...... *G06F 12/0811* (2013.01); *G06F 12/0815* (2013.01); *G06F 12/0828* (2013.01); *G06F 12/0831* (2013.01); *G06F 12/0855* (2013.01); *G06F 12/0857* (2013.01); *G06F 12/0875* (2013.01); *G06F 12/0891* (2013.01); *G06F 12/10* (2013.01); *G06F 12/1009* (2013.01); *G06F 13/124* (2013.01); *G06F 13/1642* (2013.01); *G06F 13/1663* (2013.01); *G06F 13/1668* (2013.01); *G06F 13/4027* (2013.01); *H03M 13/015* (2013.01); *H03M 13/098* (2013.01); *H03M 13/1575* (2013.01); *H03M 13/276* (2013.01); *H03M 13/2785* (2013.01); *G06F 12/0833* (2013.01); *G06F 12/0846* (2013.01); *G06F 12/0851* (2013.01); *G06F 12/0862* (2013.01); *G06F 2212/1008* (2013.01); *G06F 2212/1016* (2013.01); *G06F 2212/1024* (2013.01); *G06F 2212/1048* (2013.01); *G06F 2212/304* (2013.01); *G06F 2212/452* (2013.01); *G06F 2212/6024* (2013.01); *G06F 2212/657* (2013.01)

(56) References Cited

U.S. PATENT DOCUMENTS

| | | |
|---|---|---|
| 9,298,665 B2 | 3/2016 | Pierson et al. |
| 9,652,404 B2 | 5/2017 | Pierson et al. |
| 2007/0083735 A1* | 4/2007 | Glew .................. G06F 9/3855 712/214 |
| 2008/0320236 A1* | 12/2008 | Ueda .................. G06F 12/0831 711/146 |
| 2012/0210073 A1 | 8/2012 | Eichenberger et al. |
| 2018/0336133 A1 | 11/2018 | Turner et al. |
| 2019/0102301 A1* | 4/2019 | Li ....................... G06F 12/0811 |
| 2019/0243654 A1 | 8/2019 | Mirhosseininiri et al. |

* cited by examiner

DELAYED SNOOP FOR IMPROVED MULTI-PROCESS FALSE SHARING PARALLEL THREAD PERFORMANCE

CROSS-REFERENCE TO RELATED APPLICATIONS

This application is a Continuation of U.S. application Ser. No. 16/601,947 filed Oct. 15, 2019, which claims priority to U.S. Provisional Application No. 62/745,842 filed Oct. 15, 2018, which are hereby incorporated by reference.

BACKGROUND

In a multi-core coherent system, multiple processor and system components share the same memory resources, such as on-chip and off-chip memories. Memory caches (e.g., caches) typically are an amount of high-speed memory located operationally near (e.g., close to) a processor. A cache is more operationally nearer to a processor based on latency of the cache, that is, one many processor clock cycles for the cache to fulfill a memory request. Generally, cache memory closest to a processor includes a level 1 (L1) cache that is often directly on a die with the processor. Many processors also include a larger level 2 (L2) cache. This L2 cache is generally slower than the L1 cache but may still be on the die with the processor cores. The L2 cache may be a per processor core cache or shared across multiple cores. Often, a larger, slower L3 cache, either on die, as a separate component, or another portion of a system on a chip (SoC) is also available to the processor cores.

Ideally, if all components had the same cache structure, and would access shared resources through cache transactions, all the accesses would be identical throughout the entire system, aligned with the cache block boundaries. But usually, some components have no caches, or, different components have different cache block sizes. For a heterogeneous system, accesses to the shared resources can have different attributes, types and sizes. For example, a central processing unit (CPU) of a system may have different sized or different speed memory caches as compared to a digital signal processor (DSP) of the system. On the other hand, the shared resources may also be in different formats with respect to memory bank structures, access sizes, access latencies and physical locations on the chip.

To maintain data coherency, a coherent interconnect is usually added in between the master components and shared resources to arbitrate among multiple masters' requests and guarantee data consistency when data blocks are shared among multiple masters or modified for each resource slave. With various accesses from different components to the same slave, the interconnect usually handles the accesses in a serial fashion to guarantee atomicity and to meet the slave's access requests while maintaining data ordering to ensure data value correctness. In a multi-slave coherent system, the data consistency and coherency is generally guaranteed on a per slave bases. This makes the interconnect an access bottleneck for a multi-core multi-slave coherence system.

To reduce CPU cache miss stall overhead, cache components could issue cache allocate accesses with the request that the lower level memory hierarchy must return the "critical line first" to un-stall the CPU, then the non-critical line to finish the line fill. In a shared memory system, to serve one CPU's "critical line first" request could potentially extend the other CPU's stall overhead and reduce the shared memory throughput if the memory access types and sizes are not considered. The problem therefore to solve is how to serve memory accesses from multiple system components to provide low overall CPU stall overhead and guarantee maximum memory throughput.

Due to the increased number of shared components and expended shareable memory space, supporting data consistency while reducing memory access latency for all cores while maintaining maximum shared memory bandwidth and throughput is a challenge. For example, many processes, such as machine learning or multichannel data or voice processing, utilize a multi-core, multi-processing concept utilizing multiple processor cores executing a common computation on different data. In systems with a coherence interconnect, the cores may operate on data included on portions of a single cache line. As an example with a 16 byte cache line, each of four cores may perform a common computation as against different four byte segments of the cache line, with the first core handling the first four bytes, the second core handing the second four bytes, and so forth. This may be referred to as false sharing. Maintaining cache coherency in a false sharing scenario is challenging as writing to a single cache line would typically happen by requesting ownership of the cache line, snooping and evicting the other cores, and then writing to the cache line. This results in each core of the four cores having to snoop and evict each of the other three cores when the core needs to write back results of the computation in a serial fashion.

SUMMARY

This disclosure relates to a method for maintaining cache coherency, the method comprising storing a set of data blocks in a cache line of a main cache memory, the set of data blocks associated with a main process, storing a first local copy of the set of data blocks in a first local cache memory of a first processor, of a set of two or more processors, wherein the first processor is configured to modify data within a first data block of the first local copy without modifying data in other data blocks of the set of data blocks of the first local copy, storing a second local copy of the set of data blocks in a second local cache memory of a second processor, of a set of two or more processors, executing, on the first processor, a first child process of the main process to generate first output data, writing the first output data to the first data block of the first local copy as a write through, writing the first output data to the first data block of the main cache memory as a part of the write through, transmitting an invalidate request to the second local cache memory, marking the second local copy of the set of data blocks as delayed, and transmitting an acknowledgment to the invalidate request.

This disclosure also relates to a processing system comprising a main cache memory storing a set of data blocks in a cache line, the set of data blocks associated with a main process, a first processor of two or more processors is configured to store a first local copy of the set of data blocks in a first local cache memory of the first processor, modify data within a first data block of the first local copy without modifying data in other data blocks of the set of data blocks of the first local copy, execute, a first child process of the main process to generate first output data, write the first output data to the first data block of the first local copy as a write through, and write the first output data to the first data block of the main cache memory as a part of the write through, a memory controller configured to transmit an invalidate request to a second local cache memory, and a second processor of the two or more processors is configured to store a second local copy of the set of data blocks in the second local cache memory of the second processor, mark the second local copy of the set of data blocks as delayed, and transmit an acknowledgment to the invalidate request.

This disclosure further relates to a non-transitory program storage device comprising instructions stored thereon to cause a third processor associated with a main process to store a set of data blocks in a cache line of a main cache memory, the set of data blocks associated with the main process, a first processer, of a set of two or more processors to store a first local copy of the set of data blocks in the first local cache memory of the first processor, modify data within a first data block of the first local copy without modifying data in the other data blocks of the set of data blocks of the first local copy, execute, a first child process of the main process to generate first output data, write the first output data to the first data block of the first local copy as a write through, and write the first output data to the first data block of the main cache memory as a part of the write through, a memory controller to transmit an invalidate request to a second local cache memory, and a second processor of the two or more processors to store a second local copy of the set of data blocks in the second local cache memory of the second processor, mark the second local copy of the set of data blocks as delayed, and transmit an acknowledgment to the invalidate request.

BRIEF DESCRIPTION OF THE DRAWINGS

For a detailed description of various examples, reference will now be made to the accompanying drawings in which.

DETAILED DESCRIPTION

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). In accordance with embodiments of this disclosure, techniques are provided for parallelizing writing to a common cache line.

Figure 1:
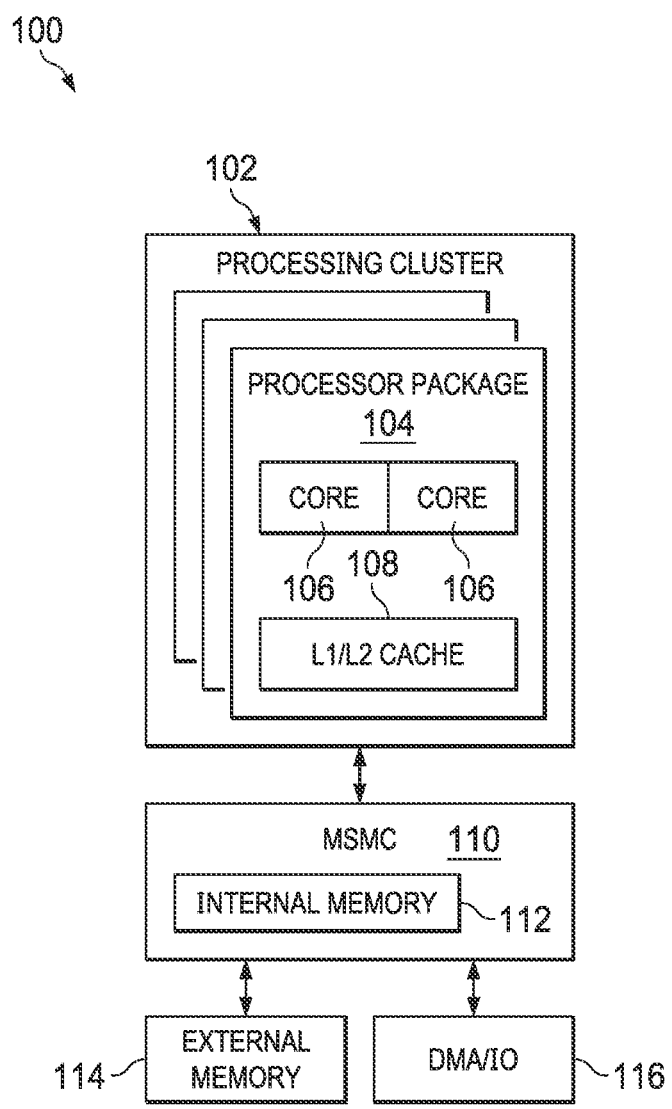
FIG. 1 illustrates a multi-core processing system, in accordance with aspects of the present disclosure.

FIG. 1 is a functional block diagram of a multi-core processing system 100, in accordance with aspects of the present disclosure. System 100 is a multi-core SoC that includes a processing cluster 102 including one or more processor packages 104. The one or more processor packages 104 may include one or more types of processors, such as a CPU, GPU, DSP, etc. As an example, a processing cluster 102 may include a set of processor packages split between DSP, CPU, and GPU processor packages. Each processor package 104 may include one or more processing cores. As used herein, the term "core" refers to a processing module that may contain an instruction processor, such as a digital signal processor (DSP), central processing unit (CPU) or other type of microprocessor. Each processor package also contains one or more caches 108. These caches 108 may include one or more first level (L1) caches, and one or more second level (L2) caches. For example, a processor package 104 may include four cores, each core including an L1 data cache and L1 instruction cache, along with a L2 cache shared by the four cores.

The multi-core processing system 100 also includes a multi-core shared memory controller (MSMC) 110, through which is connected one or more external memories 114 and input/output direct memory access clients 116. The MSMC 110 also includes an on-chip internal memory 112 system which is directly managed by the MSMC 110. In certain embodiments, the MSMC 110 helps manage traffic between multiple processor cores, other mastering peripherals or direct memory access (DMA) and allows processor packages 104 to dynamically share the internal and external memories for both program instructions and data. The MSMC internal memory 112 offers flexibility to programmers by allowing portions to be configured as shared level-2 RAM (SL2) or shared level-3 RAM (SL3). External memory 114 may be connected through the MSMC 110 along with the internal shared memory 112 via a memory interface (not shown), rather than to chip system interconnect as has traditionally been done on embedded processor architectures, providing a fast path for software execution. In this embodiment, external memory may be treated as SL3 memory and therefore cacheable in L1 and L2 (e.g., caches 108).

Figure 2:
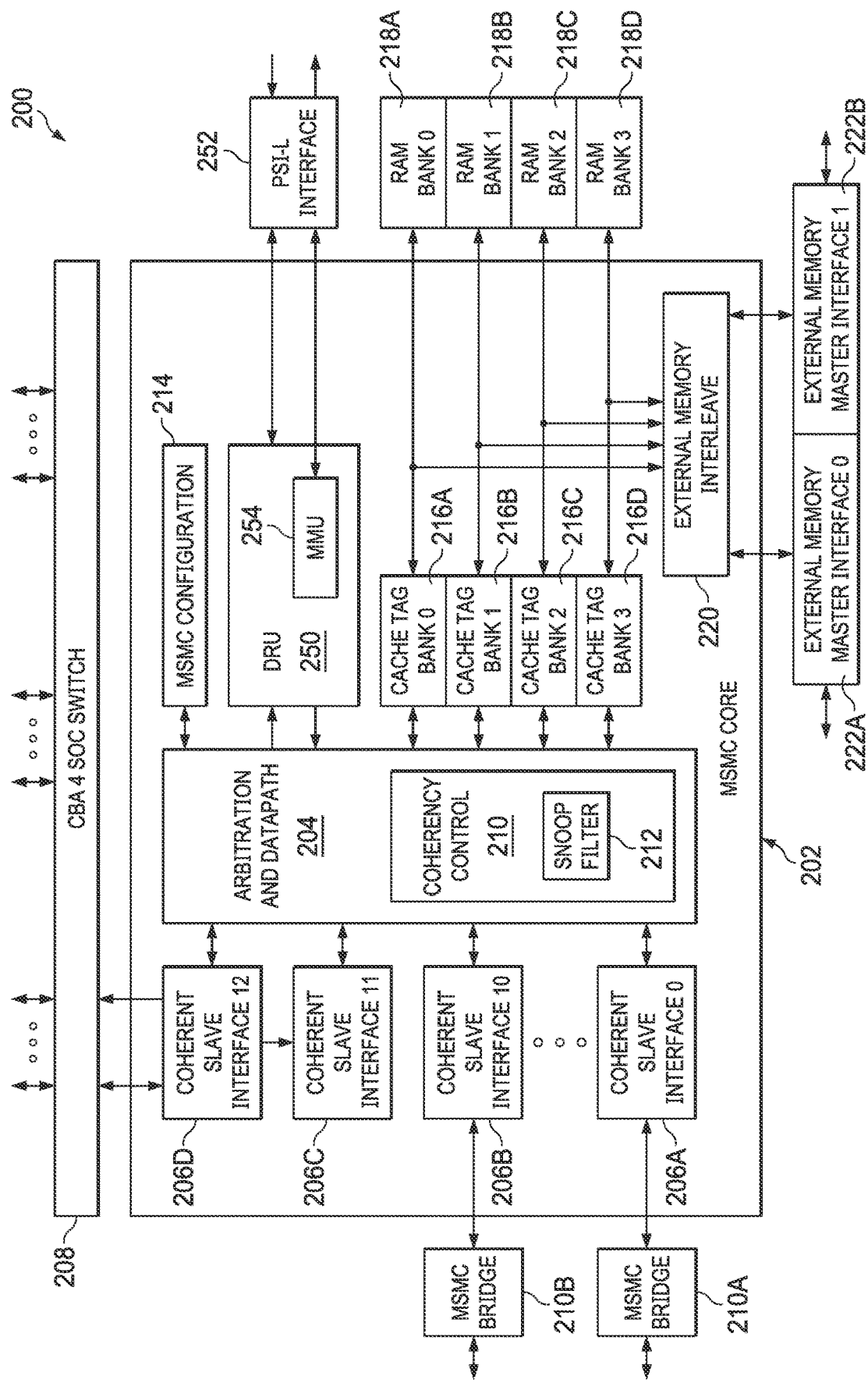
FIG. 2 is a functional block diagram of a MSMC, in accordance with aspects of the present disclosure.

FIG. 2 is a functional block diagram of a MSMC 200, in accordance with aspects of the present disclosure. The MSMC 200 includes a MSMC core logic 202 defining the primary logic circuits of the MSMC. The MSMC 200 is configured to provide an interconnect between master peripherals (e.g., devices that access memory, such as processors, processor packages, direct memory access/input output devices, etc.) and slave peripherals (e.g., memory devices, such as double data rate random access memory, other types of random access memory, direct memory access/input output devices, etc.). The master peripherals may or may not include caches. The MSMC 200 is configured to provide hardware based memory coherency between master peripherals connected to the MSMC 200 even in cases in which the master peripherals include their own caches. The MSMC 200 may further provide a coherent level 3 cache accessible to the master peripherals and/or additional memory space (e.g., scratch pad memory) accessible to the master peripherals.

The MSMC core 202 also includes a data routing unit (DRU) 250, which helps provide integrated address translation and cache prewarming functionality and is coupled to a packet streaming interface link (PSI-L) interface 252, which is a shared messaging interface to a system wide bus supporting DMA control messaging. The DRU includes an integrated DRU memory management unit (MMU) 254.

DMA control messaging may be used by applications to perform memory operations, such as copy or fill operations, in an attempt to reduce the latency time needed to access that memory. Additionally, DMA control messaging may be used to offload memory management tasks from a processor. However, traditional DMA controls have been limited to using physical addresses rather than virtual memory addresses. Virtualized memory allows applications to access memory using a set of virtual memory addresses without having to having any knowledge of the physical memory addresses. An abstraction layer handles translating between the virtual memory addresses and physical addresses. Typically, this abstraction layer is accessed by application software via a supervisor privileged space. For example, an application having a virtual address for a memory location and seeking to send a DMA control message may first make a request into a privileged process, such as an operating system kernel requesting a translation between the virtual address to a physical address prior to sending the DMA control message. In cases where the memory operation crosses memory pages, the application may have to make separate translation requests for each memory page. Additionally, when a task first starts, memory caches for a processor may be "cold" as no data has yet been accessed from memory and these caches have not yet been filled. The costs for the initial memory fill and abstraction layer translations can bottleneck certain tasks, such as small to medium sized tasks which access large amounts of memory. Improvements to DMA control message operations to prewarm near memory caches before a task needs to access the near memory cache may help improve these bottlenecks.

The MSMC core 202 includes a plurality of coherent slave interfaces 206A-D. While in the illustrated example, the MSMC core 202 includes thirteen coherent slave interfaces 202 (only four are shown for conciseness), other implementations of the MSMC core 202 may include a different number of coherent slave interfaces 206. Each of the coherent slave interfaces 206A-D is configured to connect to one or more corresponding master peripherals. Example master peripherals include a processor, a processor package, a direct memory access device, an input/output device, etc. Each of the coherent slave interfaces 206 is configured to transmit data and instructions between the corresponding master peripheral and the MSMC core 202. For example, the first coherent slave interface 206A may receive a read request from a master peripheral connected to the first coherent slave interface 206A and relay the read request to other components of the MSMC core 202. Further, the first coherent slave interface 206A may transmit a response to the read request from the MSMC core 202 to the master peripheral. In some implementations, the coherent slave interfaces 206 correspond to 512 bit or 256 bit interfaces and support 48 bit physical addressing of memory locations.

In the illustrated example, a thirteenth coherent slave interface 206D is connected to a common bus architecture (CBA) system on chip (SOC) switch 208. The CBA SOC switch 208 may be connected to a plurality of master peripherals and be configured to provide a switched connection between the plurality of master peripherals and the MSMC core 202. While not illustrated, additional ones of the coherent slave interfaces 206 may be connected to a corresponding CBA. Alternatively, in some implementations, none of the coherent slave interfaces 206 is connected to a CBA SOC switch.

In some implementations, one or more of the coherent slave interfaces 206 interfaces with the corresponding master peripheral through a MSMC bridge 210 configured to provide one or more translation services between the master peripheral connected to the MSMC bridge 210 and the MSMC core 202. For example, ARM v7 and v8 devices utilizing the AXI/ACE and/or the Skyros protocols may be connected to the MSMC 200, while the MSMC core 202 may be configured to operate according to a coherence streaming credit-based protocol, such as Multi-core bus architecture (MBA). The MSMC bridge 210 helps convert between the various protocols, to provide bus width conversion, clock conversion, voltage conversion, or a combination thereof. In addition or in the alternative to such translation services, the MSMC bridge 210 may cache prewarming support via an Accelerator Coherency Port (ACP) interface for accessing a cache memory of a coupled master peripheral and data error correcting code (ECC) detection and generation. In the illustrated example, the first coherent slave interface 206A is connected to a first MSMC bridge 210A and a tenth coherent slave interface 210B is connected to a second MSMC bridge 210B. In other examples, more or fewer (e.g., 0) of the coherent slave interfaces 206 are connected to a corresponding MSMC bridge.

The MSMC core logic 202 includes an arbitration and data path manager 204. The arbitration and data path manager 204 includes a data path (e.g., a collection of wires, traces, other conductive elements, etc.) between the coherent slave interfaces 206 and other components of the MSMC core logic 202. The arbitration and data path manager 204 further includes logic configured to establish virtual channels between components of the MSMC 200 over shared physical connections (e.g., the data path). In addition, the arbitration and data path manager 204 is configured to arbitrate access to these virtual channels over the shared physical connections. Using virtual channels over shared physical connections within the MSMC 200 may reduce a number of connections and an amount of wiring used within the MSMC 200 as compared to implementations that rely on a crossbar switch for connectivity between components. In some implementations, the arbitration and data path 204 includes hardware logic configured to perform the arbitration operations described herein. In alternative examples, the arbitration and data path 204 includes a processing device configured to execute instructions (e.g., stored in a memory of the arbitration and data path 204) to perform the arbitration operations described herein. As described further herein, additional components of the MSMC 200 may include arbitration logic (e.g., hardware configured to perform arbitration operations, a processor configure to execute arbitration instructions, or a combination thereof). The arbitration and data path 204 may select an arbitration winner to place on the shared physical connections from among a plurality of requests (e.g., read requests, write requests, snoop requests, etc.) based on a priority level associated with a requestor, based on a fair-share or round robin fairness level, based on a starvation indicator, or a combination thereof.

The arbitration and data path 204 further includes a coherency controller 224. The coherency controller 224 includes a snoop filter 212. The snoop filter 212 is a hardware unit that store information indicating which (if any) of the master peripherals stores data associated with lines of memory of memory devices connected to the MSMC 200. The coherency controller 224 is configured to maintain coherency of shared memory based on contents of the snoop filter 212.

The MSMC 200 further includes a MSMC configuration component 214 connected to the arbitration and data path 204. The MSMC configuration component 214 stores various configuration settings associated with the MSMC 200. In some implementations, the MSMC configuration component 214 includes additional arbitration logic (e.g., hardware arbitration logic, a processor configured to execute software arbitration logic, or a combination thereof).

The MSMC 200 further includes a plurality of cache tag banks 216. In the illustrated example, the MSMC 200 includes four cache tag banks 216A-D. In other implementations, the MSMC 200 includes a different number of cache tag banks 216 (e.g., 1 or more). The cache tag banks 216 are connected to the arbitration and data path 204. Each of the cache tag banks 216 is configured to store "tags" indicating memory locations in memory devices connected to the MSMC 200. Each entry in the snoop filter 212 corresponds to a corresponding one of the tags in the cache tag banks 216. Thus, each entry in the snoop filter indicates whether data associated with a particular memory location is stored in one of the master peripherals.

Each of the cache tag banks 216 is connected to a corresponding RAM bank 218. For example, a first cache tag bank 216A is connected to a first RAM bank 218A etc. Each entry in the RAM banks 218 is associated with a corresponding entry in the cache tag banks 216 and a corresponding entry in the snoop filter 212. Entries in the RAM banks 218 may be used as an additional cache or as additional memory space based on a setting stored in the MSMC configuration component 214. The cache tag banks 216 and the RAM banks 218 may correspond to RAM modules (e.g., static RAM). While not illustrated in FIG. 2, the MSMC 200 may include read modify write queues connected to each of the RAM banks 218. These read modify write queues may include arbitration logic, buffers, or a combination thereof.

The MSMC 200 further includes an external memory interleave component 220 connected to the cache tag banks 216 and the RAM banks 218. One or more external memory master interfaces 222 are connected to the external memory interleave 220. The external memory interfaces 222 are configured to connect to external memory devices (e.g., DDR devices, direct memory access input/output (DMA/IO) devices, etc.) and to exchange messages between the external memory devices and the MSMC 200. The external memory devices may include, for example, the external memories 114 of FIG. 1, the DMA/IO clients 116, of FIG. 1, or a combination thereof. The external memory interleave component 220 is configured to interleave or separate address spaces assigned to the external memory master interfaces 222. While two external memory master interfaces 222A-B are shown, other implementations of the MSMC 200 may include a different number of external memory master interfaces 222.

Figure 3:
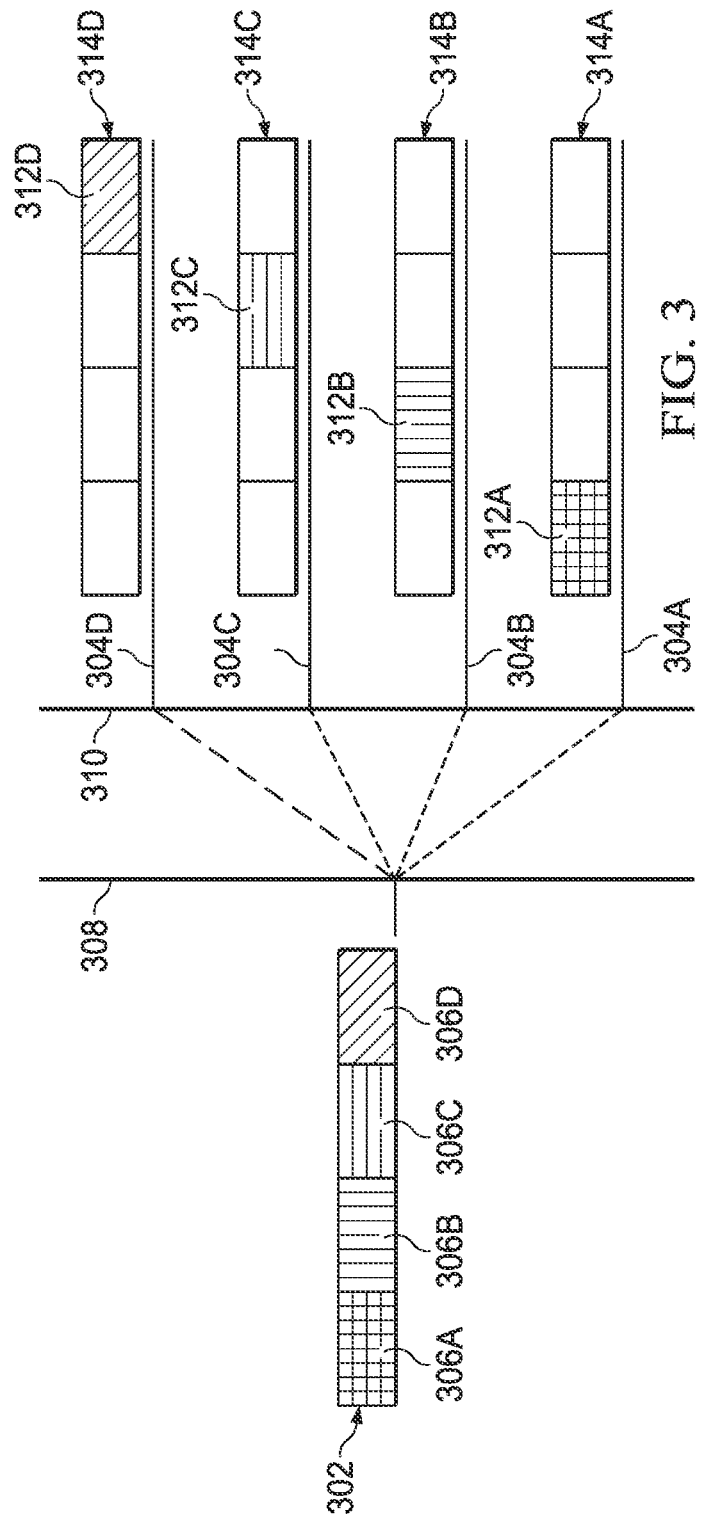
FIGS. 3-6, 7A-7B, and 8 are block diagrams illustrating a cache coherency protocol, in accordance with aspects of the present disclosure.

In certain cases, the MSMC 200 may be configured to interface, via the MSMC bridge 210, with a master peripheral, such as a compute cluster having multiple processing cores. The MSMC 200 may further be configured to maintain a coherent cache for a process executing on the multiple processing cores. FIG. 3 is a block diagram of a cache coherency protocol, in accordance with aspects of the present disclosure. While this example is discussed in the context of a MSMC, it may be understood that aspects of this disclosure may apply to any multi-core interconnect. In this example, the MSMC may include input data in a main cache line 302. The input data may be placed in the main cache line 302 by a symmetrical multi-core processing (SMP) main thread. For example, the main cache line 302 may be in a L3 cache controlled by the MSMC. This main thread, or host task, may be executing on another processor core separate from processor cores 304A-304D, or may be executing on one of processor cores 304A-304D. The main cache line 302 includes a set of four data blocks 306A-306D to be executed on in parallel by the processor cores 304A-304D. While described in the context of four data blocks and four processor cores, it may be understood by persons having ordinary skill in the art that any number of data blocks and corresponding number of processor cores may be used, consistent with aspects of the present disclosure.

After a fork command is issued 308 on the main thread, the child threads executing on processor cores 304A-304D may each execute a diverge instruction 310 to place the cache memory system into a child threading mode. The MSMC may read the cache line containing data blocks 306A-306D and provide a copy of the cache line to each of the processor cores 304A-304D. Each processor core 304A-304D caches a copy of at least a portion of data blocks 306A-306D into their own local caches 314A-314D, such as a L1 data cache. The data blocks 306A-306D copied into local caches 312A-314D may be marked as shared, rather than owned. Local caches 312A-314D may be controlled by local cache controllers (not shown) on the respective processor cores 304A-304D. Each child thread includes an indication of which data block of the data blocks 306A-306D the corresponding child thread is assigned to. For example, processor core 304A is assigned to work on data block 312A, which may correspond to bytes 0-3 of the data blocks 306A-306D, processor core 304B is assigned to work on data block 312B corresponding to bytes 4-7 of the data blocks 306A-306D, and so forth.

Figure 4:
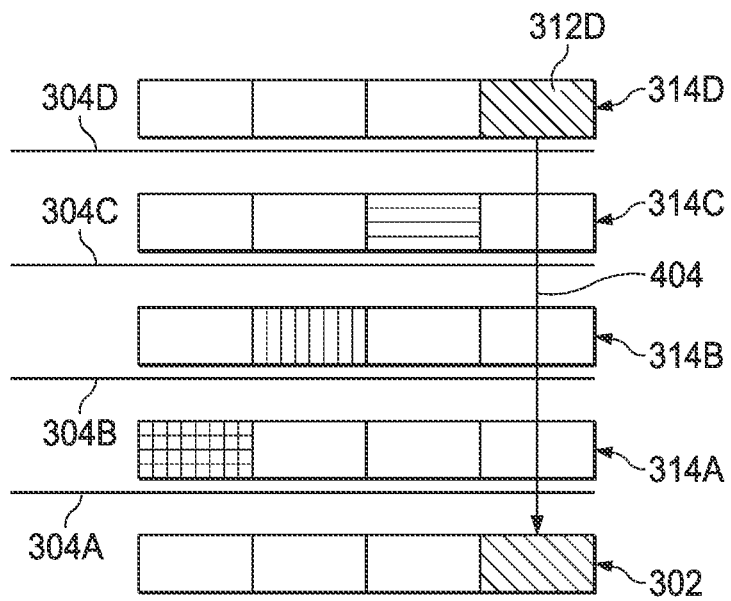

Each processor core 304A-304D may freely modify their cache memory 314A-314D within their assigned data block as required by the child thread process. However, the processor cores 304A-304D may not be permitted to modify the cache memory 314A-314D outside of their assigned data block. Referring now to FIG. 4, in this example, processor core 304D performs a write to data block 312D of local cache memory 314D. Writes by the child thread processes may be performed as write throughs where each write is written both to the processor core cache and written through to the main cache line 302 associated with the main thread, in this example, in the MSMC. The snoop filter (e.g., snoop filter 212 of FIG. 2) may be updated to reflect which processor core is performing a write. The main cache line 302 may be configured to only accept write throughs to the data blocks corresponding to the data blocks assigned to the respective child thread process.

Figure 5:
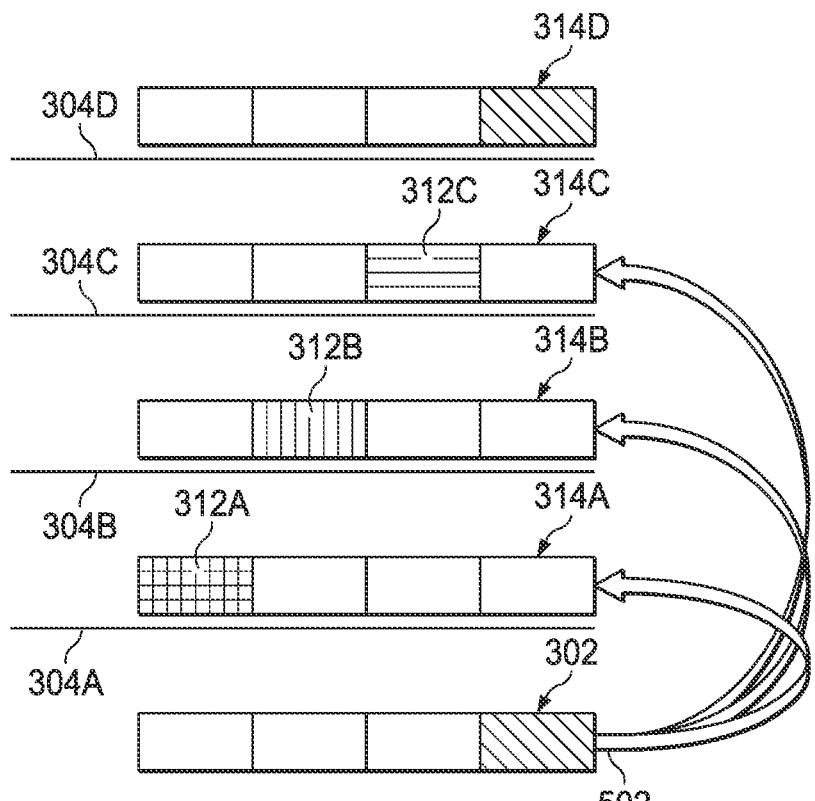

After the MSMC receives the write through of the data block, such as data block 312D, the MSMC snoops the other processor cores 304A-304C to determine that the main cache line 302 is being accessed by those other processor cores 304A-304C. The MSMC then sends a cache message 502 of FIG. 5 to the other processor cores 304A-304C to evict them from the main cache line 302. After the other processor cores 304A-304C receive the cache invalidate message from the MSMC, the other processor cores 304A-304C respond to the MSMC with an acknowledgement message. Rather than executing the invalidation and evicting the cached blocks of main cache line 302 from their local caches 314A-314D, the cached blocks of main cache line 302 in local caches 314A-314D are marked, for example, as delayed snoop by the local cache controller of the respective other processor core. The other processor cores 304A-304C continue to utilize their respective data blocks 312A-312C, writing to the respective data blocks 312A-312C using write throughs also.

Figure 6:
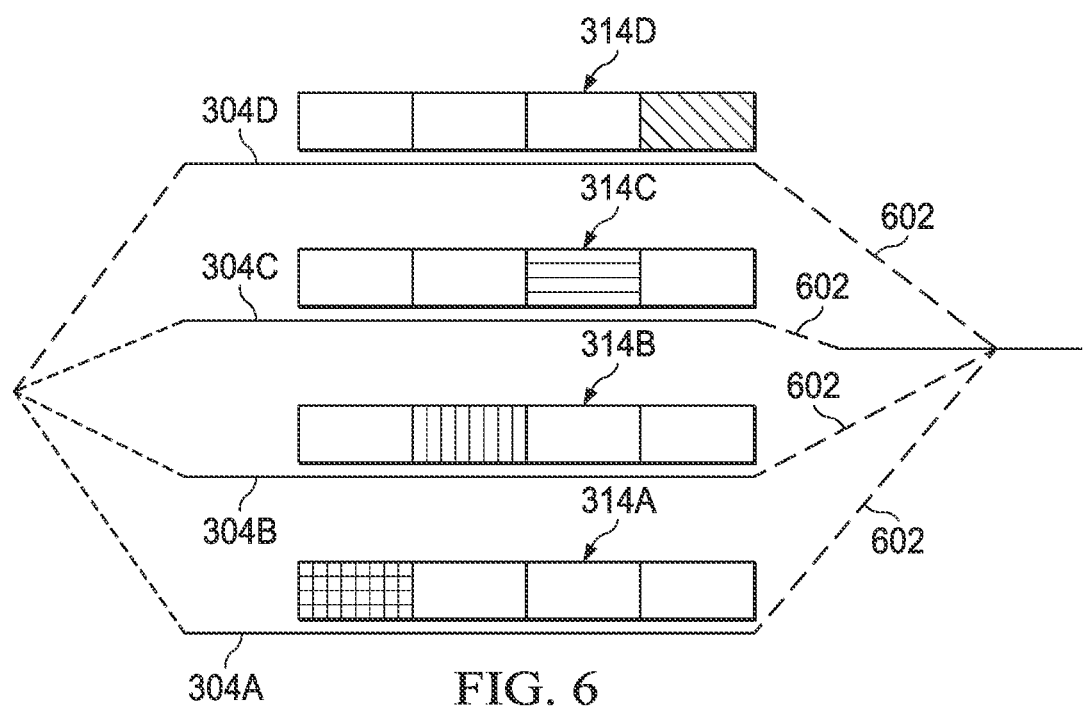

According to aspects of the present disclosure as shown in FIG. 6, as each processor cores 304A-304D finishes executing the child thread, the respective processor core 304A-304D issues a converge instruction 602. The converge instruction indicates to the main thread that the respective processor core 304A-304D has completed execution of the child thread. The main thread may track the processor core 304A-304D as they return from executing the converge instruction. As writes to the respective data blocks 312A-312D were completed using write throughs, main cache line 302 is updated with and includes the results of the child thread when the converge instruction is executed. After the child thread completes and the converge instruction is executed, the local cache controller of the local caches 312A-314D may mark any cache lines previously marked as delayed snoop to regular snoop and invalidate the cache lines that were marked delayed snoop. For example, where processor core 304D finishes before the other processors cores 304A-304C, processor core 304D finishes the converge instruction and checks its local cache, such as an L1 cache, for cache lines marked as delayed snoop. As processor core 304D was the first to finish, no cache lines are marked as delayed snoop and processor core 304D does not invalidate any cache lines. Continuing with the example, processor core 304C then finishes. As processor core 304C was not the first to finish, there are cache lines marked with delay snoop in the local cache, as discussed above in conjunction with FIG. 5. Those cache lines marked as delay snoop are set to prompt snoop and invalidated (e.g., the delayed snoop). After all processor cores 304A-304D execute the converge instruction, the main thread determines that all of the child threads have converged and the main thread can proceed on with the results from the child threads in the main cache line 302.

Figure 7A:
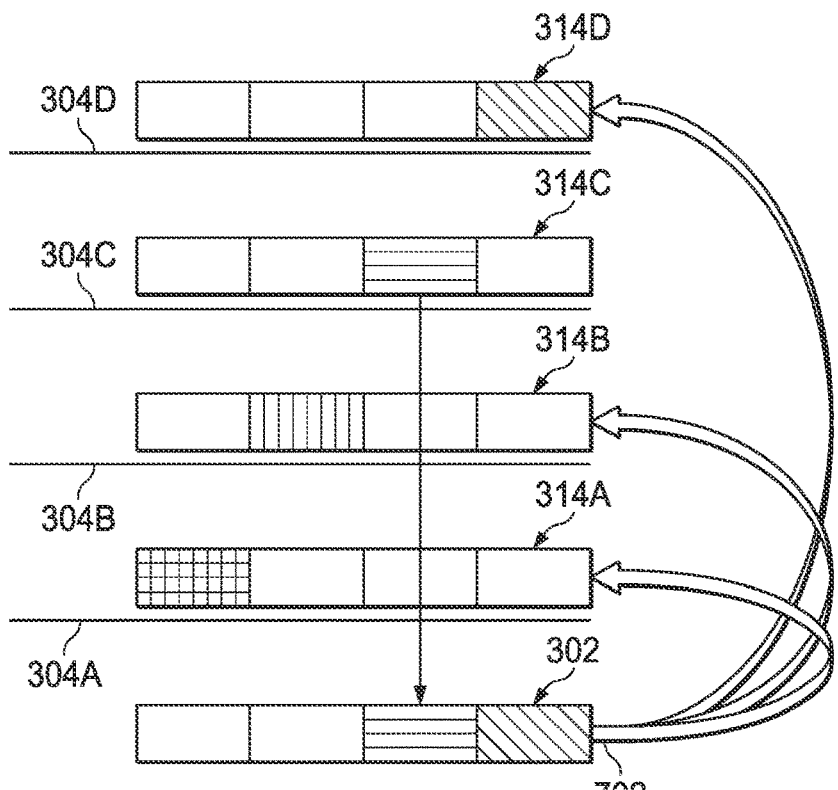
Figure 7B:
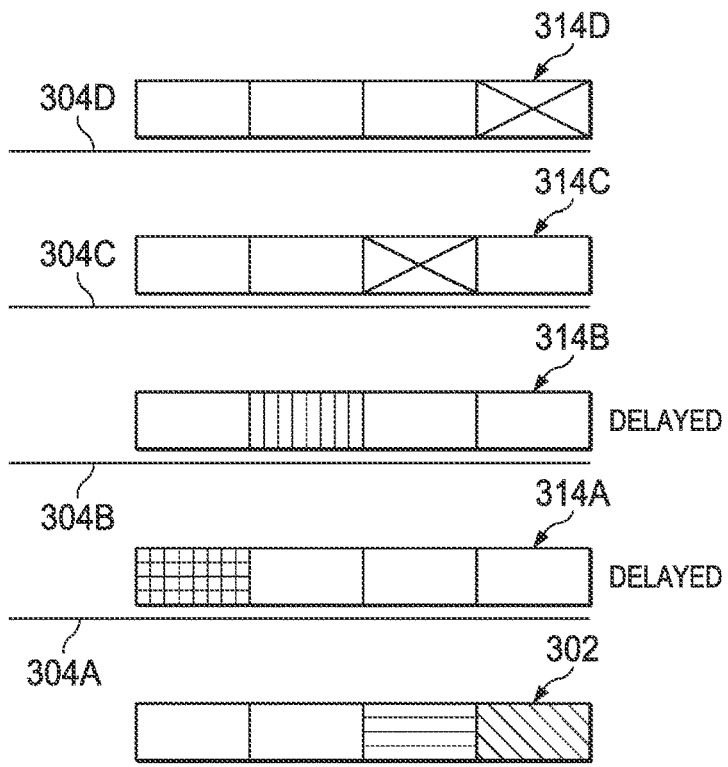

In the example discussed above, processor core 304D was the first to finish and did not invalidate any cache lines of its local cache 314D, as no cache lines were previously marked as delay snoop. As shown in FIG. 7A, processor core 304C then finishes by executing the converge instruction and marks cache lines in its local cache 314C as invalid as shown in local cache 314C of FIG. 7B. The MSMC may also trigger a snoop 702 after core 304C finishes. As processor core 304D finished without invalidating its local cache, the snoop filter indicates that the processor core 304D has a cached copy of the main cache line 302 and snoop 702 is sent to processor core 304D, along with processor cores 304A-304B, which, in this example, are still working. As processor core 304D has already finished, the corresponding cache line from local cache 314D of processor core 304D may be invalidated, as seen in FIG. 7B. Processor cores 304A-304B are still executing and thus mark the cached blocks of main cache line 302 in local caches 314A-314B as delayed snoop. After invalidating the corresponding cache line from their local caches 314C-314D, processor cores 304C-304D may send an indication to the MSMC that the invalidates have been completed. The MSMC may then remove the appropriate entries in the snoop filter and stop transmitting snoops to the processor cores 304C-304D with respect to the main cache line 302.

Figure 8:
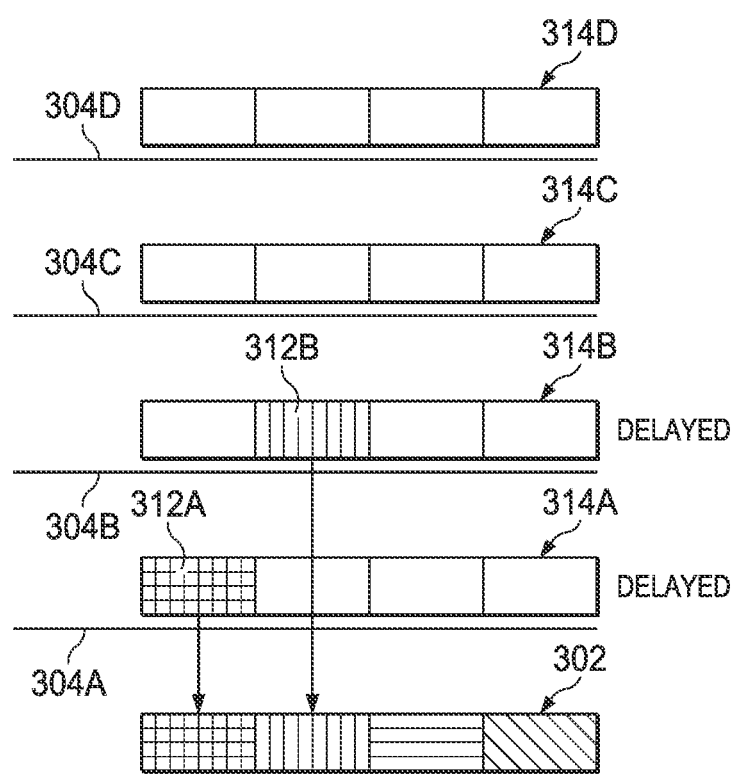

As shown in FIG. 8, once processor cores 304A-304B complete, they can write results to their respective data blocks 312A-312B of the local caches 314, which write through to respective data blocks in the main cache line 302. As discussed above in conjunction with FIG. 5, processor cores 304A-304B may execute a converge command and cache lines marked as delay snoop are set to prompt snoop and invalidated.

In certain cases, the MSMC may be configured to adjust operating modes of caches coupled to the MSMC. For example, the MSMC may be coupled to the L1 cache of a specific processor core, as well as an L2 cache, which may be shared as among multiple processor cores. The MSMC may also include or be coupled to an amount of L3 cache. The MSMC may transmit one or more cache configuration messages to coupled caches to set an operating mode of the cache, such as whether the cache is set as a write back, write allocate, or write through. As discussed above, for delayed snoop, the L1 cache may be configured as a write through cache. The L2 cache may also be configured as a write through cache to simplify the process and enable a more direct view of the L1 cache to the MSMC. In certain cases, snooping of the L2 cache may be performed according to a normal snooping technique. The L3 cache may then be configured as write back cache and used to store values as processing on the child threads proceeds. Completed results may be written to a backing store, such as main memory, as processing of the data blocks are completed on the child threads, for example via a non-blocking channel (e.g., memory transactions that are not dependent upon the completion of another transaction, such as snooping, in order to complete).

Figure 9:
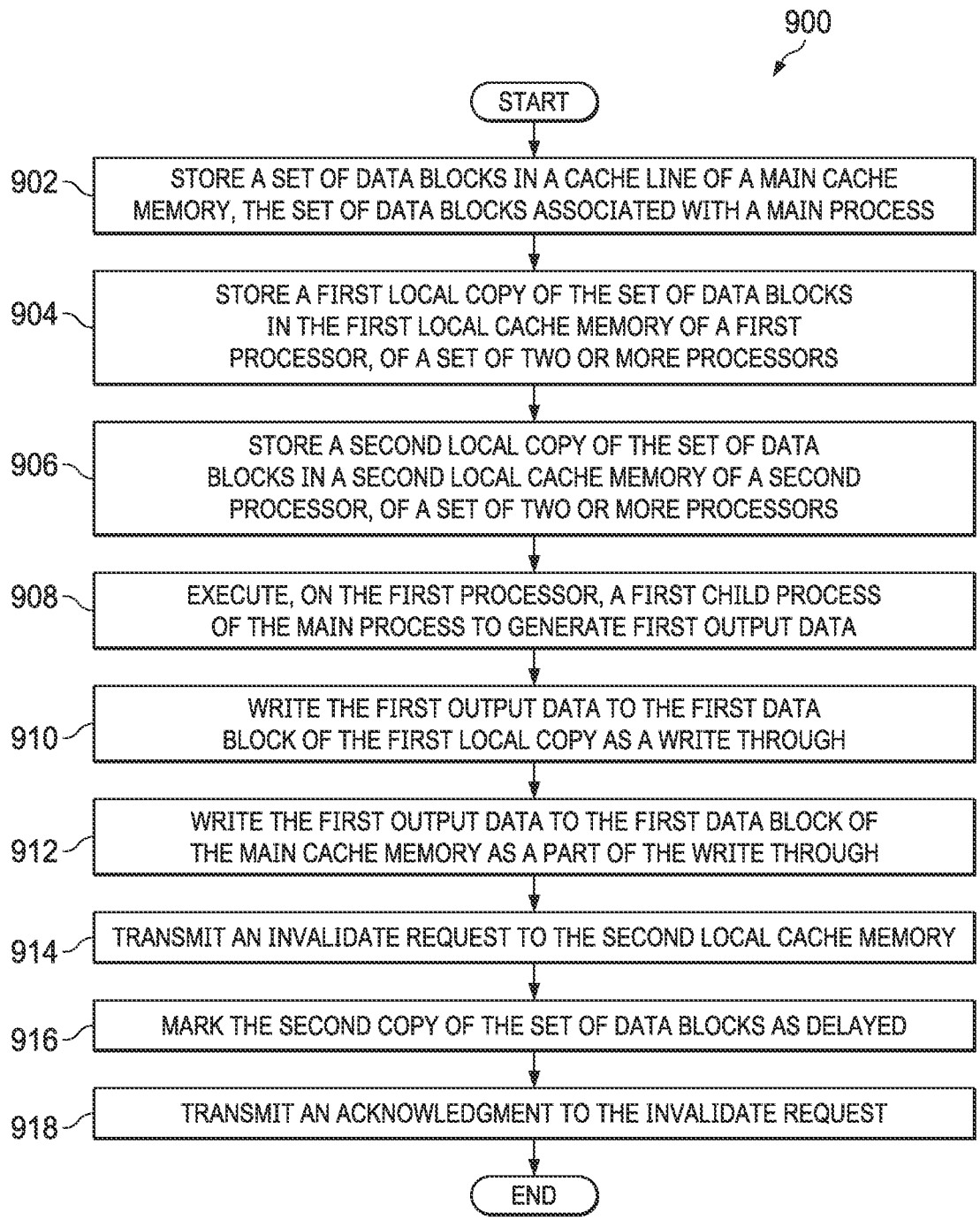
FIG. 9 is a flow diagram illustrating a technique for maintaining cache coherence, in accordance with aspects of the present disclosure.

FIG. 9 is a flow diagram illustrating a technique 900 for maintaining cache coherence, in accordance with aspects of the present disclosure. At block 902, a set of data blocks associated with a main process is stored in a cache line of a main cache memory. As an example, a SMP main thread may cause a set of data to be stored in a cache line of a cache memory. This cache memory may be within or coupled to and controlled by a memory controller, such as the MSMC. The set of data may be logically divided into blocks. Each block may be a contiguous portion of the cache line, such as the first N bytes, the next N bytes, etc. In certain cases, each block may be the same size or different sizes. Each block includes information for execution by a child process executing on a separate processor of a set of processors. These processors (e.g., processor cores) may be separate from another processor executing the main thread. At block 904, a first copy of the set of data blocks is stored in a first local cache memory of a first processor, of a set of two or more processors, and at block 906, a second local copy of the set of data blocks are stored in a second local cache memory of a second processor. For example, each processor of the set of processors may include a local cache memory, such as an L1 cache memory. The memory controller may copy or cause to the data blocks to be stored into a local cache of each processor. Each processor receives a set of commands defining a process for the processor to perform. Generally, in a SMP program, the set of commands executed by each processor is the same, but the data on which the commands are executed on, in this example stored in the local cache memory of the processors, are different. The set of commands includes an indication of which data blocks in the local cache a particular processor is assigned to work on. The set of commands may also include a diverge command which may configure the processor and/or memory controller to only permit writes by the processor to the cache line shared by the processors in data blocks assigned to the particular processor and may place the local cache of the processor into a shared, write through mode. In certain cases, each processor of the set of processors receives a copy of all of the data blocks. In other cases, each processor receives a copy of only the data blocks assigned to that processor.

At block 906, the first processor executes a first child process forked from the main process to generate first output data. For example, a processor executes the set of commands on the data blocks assigned to the processor and generates output data. At block 908, the first output data is written to the first data block of the first local copy as a write through, and at block 910 the first output data is written to the first data block of the main cache memory as a part of the write through. For example, the processor writes the output data to the local cache memory in a write through mode, which causes the output data to also be written to corresponding data blocks of the main cache memory.

At block 912, an invalidate request is transmitted to the second local cache memory. As an example, the memory controller, after receiving the write through to the main cache memory may transmit a snoop message to the second local cache memory to invalidate the cache line stored in the second local cache. At block 914, the second copy of the set of data blocks are marked as delayed. For example, a memory controller of the second processor may mark the one or more of the data blocks as delayed snoop without invalidating the data blocks. At block 916, an acknowledgement to the invalidate request is transmitted. For example, the second processor or the memory controller of the second processor may send an acknowledgement message to the memory controller without invalidating the data blocks.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims. While the specific embodiments described above have been shown by way of example, it will be appreciated that many modifications and other embodiments will come to the mind of one skilled in the art having the benefit of the teachings presented in the foregoing description and the associated drawings. Accordingly, it is understood that various modifications and embodiments are intended to be included within the scope of the appended claims.

What is claimed is:

1. A method of a cache memory system comprising:
receiving, on a main cache line, a first data and a second data;
issuing, on a main thread, a fork command;
in response to the fork command, executing, by a first processor and a second processor, a diverge instruction;
in response to the diverge instruction:
caching, by the first processor, a first copy of the main cache line in a first local cache of the first processor; and
caching, by the second processor, a second copy of the main cache line in a second local cache of the second processor;
writing, by the first processor, to the first data in the first copy of the main cache line and to the first data in the main cache line;
in response to writing to the first data of the main cache line, snooping, by the cache memory system;
in response to the snooping, transmitting, by a memory controller, an invalidate request to the second processor to invalidate the second copy of the main cache line;
in response to the invalidate request, marking, by the second processor, a cache line associated with the second data of the second copy of the main cache line as a delayed snoop;
writing, by the second processor, to the second data in the second copy of the main cache line and to the second data in the main cache line; and
in response to the writing to the second data in the main cache line, invalidating, by the second processor, the cache line associated with the second data of the second copy of the main cache line.

2. The method of claim 1, wherein:
the main cache line is a L3 cache controlled by the memory controller; and
the memory controller comprises a multicore shared memory controller.

3. The method of claim 1, wherein:
the first data and the second data are processed in parallel.

4. The method of claim 1, wherein:
the diverge instruction configures the cache memory system in a child threading mode.

5. The method of claim 1, wherein:
the first processor processes a first thread;
the second processor processes a second thread;
the first thread includes a first indicator indicating that the first data is assigned to the first thread; and
the second thread includes a second indicator indicating that the second data is assigned to the second thread.

6. The method of claim 5, wherein:
the main cache line is configured to only accept a write through to the first data from the first thread; and
the main cache line is configured to only accept a write through to the second data from the second thread.

7. The method of claim 5, further comprising:
processing, by the first processor, the first thread;
upon completion of the first thread, executing, by the first processor, a converge instruction;
processing, by the second processor, the second thread; and
upon completion of the second thread, executing, by the second processor, the converge instruction.

8. The method of claim 1, wherein:
the snooping determines that the main cache line is being accessed by the second processor.

9. The method of claim 1, wherein:
in response to receiving the invalidate request, transmitting, by the second processor, an acknowledgment to the cache memory system.

10. The method of claim 1, further comprising:
changing, by the second processor, the delayed snoop to an immediate snoop.

11. A processing system comprising:
a main thread associated with a main cache line that includes a first set of data and a second set of data;
a memory controller configured to generate, in response to a diverge command, a first copy of the main cache line and a second copy of the main cache line;
a first processor configured to:
store the first copy of the main cache line; and
write to the first set of data in the first copy of the main cache line and the first set of data in the main cache line; and a second processor configured to:
  store the second copy of the main cache line;
  receive an invalidate request;
  in response to the invalidate request, mark a cache line associated with the second set of data of the second copy of the main cache line as a delayed snoop;
  write to the second set of data in the second copy of the main cache line and the second set of data in the main cache line; and
  invalidate the cache line associated with the second set of data of the second copy of the main cache line, in response to writing the second set of data in the main cache line.

12. The processing system of claim 11, wherein:
the main cache line is a L3 cache controlled by the memory controller; and
the memory controller is a multicore shared memory controller.

13. The processing system of claim 11, wherein:
the first processor is configured to processes the first set of data in parallel with the second processor processing the second set of data.

14. The processing system of claim 11, wherein:
the diverge command configures the processing system in a child threading mode.

15. The processing system of claim 11, wherein:
the first processor processes a first thread;
the second processor processes a second thread;
the first thread includes a first indicator indicating that the first set of data is assigned to the first thread; and
the second thread includes a second indicator indicating that the second set of data is assigned to the second thread.

16. The processing system of claim 15, wherein:
the main cache line is configured to only accept a write through to the first set of data in the main cache line from the first thread; and
the main cache line is configured to only accept a write through to the second set of data in the main cache line from the second thread.

17. The processing system of claim 11, wherein:
the first processor is configured to issue a converge instruction subsequent to writing to the first set of data in the main cache line; and
the second processor is configured to issue the converge instruction subsequent to writing to the second set of data in the main cache line.

18. The processing system of claim 11, wherein:
the memory controller is configured to snoop the second processor in response to the first processor writing to the first set of data in the main cache line; and
the memory controller is configured to send the invalidate request to the second processor.

19. The processing system of claim 11, wherein:
the second processor is configured to transmit an acknowledgment to the memory controller in response to receiving the invalidate request.

20. The processing system of claim 11, wherein:
the second processor is configured to change the delayed snoop to an immediate snoop subsequent to writing to the second set of data in the main cache line.

* * * * *